United States Patent [19]

Hsu

[11] Patent Number: 5,420,067
[45] Date of Patent: May 30, 1995

[54] METHOD OF FABRICATRING SUB-HALF-MICRON TRENCHES AND HOLES

[75] Inventor: David S. Y. Hsu, Alexandria, Va.

[73] Assignee: The United States of America as represented by the Secretary of the Navy, Washington, D.C.

[21] Appl. No.: 123,665

[22] Filed: Sep. 20, 1993

Related U.S. Application Data

[60] Continuation-in-part of Ser. No. 782,197, Oct. 24, 1991, Pat. No. 5,246,879, which is a division of Ser. No. 589,758, Sep. 28, 1990, Pat. No. 5,110,760.

[51] Int. Cl.$^6$ ............................................. H01L 21/44
[52] U.S. Cl. ...................................... 437/180; 437/912; 437/203; 148/DIG. 104
[58] Field of Search ............... 437/180, 203, 912, 228; 148/DIG. 105, DIG. 100, DIG. 104

[56] References Cited

U.S. PATENT DOCUMENTS

| | | | |
|---|---|---|---|
| 4,599,790 | 7/1986 | Kim et al. | 437/912 |
| 4,759,822 | 7/1988 | Vetanen et al. | 148/DIG. 105 |
| 4,774,206 | 9/1988 | Willer | 437/175 |
| 4,857,477 | 8/1989 | Kanamori | 437/203 |
| 4,947,413 | 8/1990 | Jewell et al. | 378/34 |
| 4,968,646 | 11/1990 | Blanchard et al. | 437/203 |
| 5,089,913 | 2/1992 | Singh et al. | 359/727 |
| 5,102,827 | 4/1992 | Chen et al. | 437/200 |
| 5,110,760 | 5/1992 | Hsu | 437/180 |
| 5,231,040 | 7/1993 | Shimura | 148/DIG. 100 |
| 5,288,654 | 2/1994 | Kasai et al. | 148/DIG. 100 |

OTHER PUBLICATIONS

Riley et al., *Limitation of low-temperature low pressure chemical vapor deposition of SiO$_2$ for the insulation of high-density multilevel very large scale integrated circuits*, J. Vac. Sci. Technol. B 7 (2), Mar./Apr. 1989, FIGS. 2 and 3, pp. 230–231.

Hatanaka et al., *H$_2$O-TEOS Plasma-CVD Realizing Dielectrics Having a Smooth Surface*, VMIC Conference, Jun. 11–12, TH–0359–0/91/0000–0435 $01.00 C 1991 IEEE, FIGS. 2 and 3, p. 438.

Lai et al., *CVD–Aluminium for Submicron VLSI Metallization*, VMIC Conference, Jun. 11–12, TH–03-59–0/91/0000–0089 $01.00 C 1991 IEEE, FIGS. 2 and 3, p. 94.

Rey et al., *Numerical Simulation of CVD Trench Filling Using a Surface Reaction Coefficient Model*, VMIC Conference, Jun. 12–13, TH–0325–1/90/0000–0425 $01.00 C 1990 IEEE, FIGS. 3 and 5, p. 426.

Ahn et al., *Advances in Production Methods in VLSI and ULSI Technology Using Isolated–Chamber Sputter Deposition of Al 1% Si Films*, VMIC Conference, Jun. 12–13, TH–0325–0/90/0000–0325 $01.00 C 1990 IEEE, FIGS. 2, 3, 4 and 6, pp. 327–328.

Raaijmakers et al., *Contact Hole Fill with Low Temperature LPCVD TiN*, Jun. 12–13, TH–0325–1/90/00-00–0219 $01.00 C 1990 IEEE, FIG. 1a, p. 222.

*Primary Examiner*—Brian E. Hearn
*Assistant Examiner*—Tuan Nguyen
*Attorney, Agent, or Firm*—Ajay S. Pathak; Thomas E. McDonnell

[57] ABSTRACT

A non-optical method for the formation of sub-half micron holes, vias, or trenches within a substrate. For example, a substrate having at least two buttresses or a trench having an interbuttress distance or a width of 1.0 to 0.5 microns, respectively, is comformally or non-conformally lined with a layer material. Thereafter, the layer material from horizontal surfaces is removed to expose the substrate underneath while leaving the layer material attached to the essentially vertical walls of the buttresses or the trenches essentially intact, thereby, narrowing the interbuttress distance or the trench width, respectively, to sub-half micron dimensions. The exposed substrate surface is then subjected to anisotropic etching to form sub-half micron trenches, holes or vias in the substrate. Finally, the buttresses and layer material are removed from the substrate. Alternatively, a template of buttresses or channel glass having openings, lined with layer material, on the order of sub-half micron widths is placed on a substrate prior to anisotropic etching to form sub-half micron holes, vias or trenches within the substrate. The template is then removed leaving a substrate surface containing sub-half micron trenches, holes or vias. The template structure once made can be used repeatedly.

6 Claims, 13 Drawing Sheets

METHOD OF FABRICATRING SUB-HALF-MICRON TRENCHES AND HOLES

CROSS REFERENCE TO RELATED APPLICATION

This is a continuation-in-part of prior application Ser. No. 07/782,197 filed on Oct. 24, 1991 by David Hsu et al., now issued as U.S. Pat. No. 5,246,879 (hereinafter the '879 patent) on Sept. 21, 1993, titled Method of Forming Nanometer-Scale Trenches and Vias and designated by Navy Case No. 73,344 incorporated herein by reference in its entirety. The '879 patent is a divisional application of U.S. patent application of Ser. No. 07/589,758, entitled METHOD OF NANOMETER LITHOGRAPHY, to David S. Y. Hsu, filed Sept. 28, 1990, now issued into U.S. Pat. No. 5,110,760 (hereinafter the '760 patent), the entirety of which is incorporated herein by reference.

BACKGROUND OF THE INVENTION

1. FIELD OF THE INVENTION

The present invention relates generally to lithographic techniques for microcircuit fabrication and more specifically to a method for forming trenches, vias and holes of sub-half-micron dimensions within microcircuit substrates.

2. DESCRIPTION OF THE RELATED ART

The performance of microelectronic components is greatly enhanced by reducing the size of electronic devices on chips and by reducing the dimensions and spacings of trenches and/or holes imprinted within the substrate. Miniaturization of feature size in the microelectronics industry by the currently used conventional photolithography methods has reached the inherent process limit of ~0.5 micron. The conventional method for fabricating trenches and/or holes in a substrate is done by photolithography and pattern transfer. The substrate is coated with a UV-sensitive resist film. The resist film is then exposed to a pattern of UV radiation, for example, a parallel grid for trench fabrication. Exposure to the UV pattern alters the resist film structure and reactivity. After developing the UV-exposed resist film, it is dissolved away leaving behind a pattern of the unexposed, unaltered resist film and bare exposed substrate surface sections which were covered by UV-exposed resist film prior to dissolution. Using directional etching, such as reactive ion etching (RIE), perpendicular to the substrate surface, trenches, vias and/or holes with largely vertical walls can be cut into the bare exposed substrate sections unprotected by the etch mask of resist film material. In general, conventional photolithography has an inherent resolution limit of about 0.5 $\mu$m for forming trenches or holes. It is almost impossible to achieve a resolution below about 0.4 $\mu$m using conventional photolithography.

Additionally, conformal deposition of various metals on the vertical and horizontal surfaces of buttresses attached to the substrate and on the bare exposed horizontal substrate surface sections between buttresses, in the region of sub-half-micron dimensions, has been difficult to achieve. It is also difficult to deposit highly conformal (i.e. of essentially the same thickness, for example, within ±2-10% of the average thickness) metal films on the vertical and horizontal surfaces of holes or trenches cut into the substrate in the region of sub-half micron-dimensions. See, Riley et al., Limitation of low-temperature low pressure chemical vapor deposition of $SiO_2$ for the insulation of high-density multilevel very large scale integrated circuits, J. VAC. SCI. TECHNOL. B 7 (2), Mar/Apr 1989, FIGS. 2 and 3, pp. 230–231, incorporated herein by reference in its entirety; See, Hatanaka et al., $H_2O$-TEOS Plasma-CVD Realizing Dielectrics Having a Smooth Surface, VMIC CONFERENCE, June 11–12, TH-0359-0/91/0000-0435 $01.00 C 1991 IEEE, FIGS. 2 and 3, p. 438, incorporated herein by reference in its entirety; See, Lai et al., CVD-Aluminium for Submicron VLSI Metallization, VMIC CONFERENCE, June 11-12, TH-0359-0/91/0000-0089 $01.00 C 1991 IEEE, FIGS. 2 and 3, p. 94, incorporated herein by reference in its entirety; See, Rey et al., Numerical Simulation of CVD Trench Filling Using a Surface Reaction Coefficient Model, VMIC CONFERENCE, June 12–13, TH-0325-1/90/0000-0425 $ 01.00 C 1990 IEEE, FIGS. 3 and 5, p. 426, incorporated herein by reference in its entirety; See, Ahn et al., Advances in Production Methods in VLSI and ULSI Technology Using Isolated-Chamber Sputter Deposition of Al 1% Si Films, VMIC CONFERENCE, June 12–13, TH-0325-0/90/0000-0325 $01.00 C 1990 IEEE, FIGS. 2, 3, 4 and 6, pp. 327–328, incorporated herein by reference in its entirety; See, Raaijmakers et al., Contact Hole Fill with Low Temperature LPCVD TiN, June 12–13, TH-0325-1/90/0000-0219 $01.00 C 1990IEEE, FIG. 1a, p. 222, incorporated herein by reference in its entirety.

For higher pattern resolution holes, vias or trenches, on the order of about 0.25 $\mu$m to about 0.5 $\mu$m in diameter or width, shorter wavelength mask exposure systems using deep UV or X-ray radiation are needed. Using deep UV lithography, feature sizes between ~0.25–0.5 microns can be achieved only with difficulty. (See U.S. Pat. No. 4,947,413 Col. 1, Lines 59–60; Col. 2, Lines 36–39; U.S. Pat. No. 5,089,913 Col. 3, Lines 37–39). X-ray photolithography can achieve a resolution below 0.1 $\mu$m; however, this method encounters problems in resist sensitivity, source intensity, mask generation and registry. In addition, X-ray photolithography is equipment intensive and expensive.

Thus, a need remains for a lithographic method by which sub-half-micron dimension trenches and/or holes can be produced consistently, inexpensively and with relative ease.

SUMMARY OF THE INVENTION

It is therefore an object of the claimed invention to consistently and reliably fabricate trenches and/or holes and/or vias of sub-half-micron dimensions in a substrate, for example, a silicon wafer.

It is therefore another object of the claimed invention to economically and relatively inexpensively fabricate trenches and/or holes and/or vias of sub-half-micron dimensions in a substrate, for example, a silicon wafer.

It is yet another object of the claimed invention to fabricate trenches and/or holes and/or vias of sub-half-micron dimensions substantially smaller than the feature sizes achievable by deep UV lithography, by only using starting structures fabricated by conventional photolithography and non-optical material processing techniques.

These and other objects are achieved by first forming at least two buttresses with an interbuttress distance of about 1.0 $\mu$m to about 0.5 $\mu$m. A buttress is a raised feature having essentially vertical walls extending from a substrate surface. Thereafter, a single deposition layer or multiple deposition layers are deposited on all exposed surfaces on and above the substrate, thereby, narrowing the distance between adjacent buttresses. Alternatively, instead of a substrate with at least two buttresses attached to the surface of the substrate, a substrate with trenches, vias or holes may be used. For example, a substrate having holes with diameters on the order of about 1.0 µm to about 0.5 µm may be used. If the substrate with trenches, holes or vias (no buttresses) is used then a single deposition layer or multiple deposition layers are deposited on all exposed substrate surfaces, including vertical surfaces (surfaces essentially perpendicular to the plane of the substrate or wafer), thereby, narrowing the diameter or width of the holes, vias, or trenches within the substrate. Thereafter, the deposited layer or multi-layer from all exposed horizontal surfaces is totally or partially removed by, for example, RIE (reactive ion etching) or ion beam sputtering, to expose horizontal substrate surface sections leaving the deposited layer or multi-layer on the largely vertical surfaces essentially intact. Next, a vertical (i.e. perpendicular to the substrate surface) etching process is carried out, leaving the remaining deposited layer or multi-layer on the largely vertical surfaces essentially intact and the substrate directly underneath the deposited layer or multi-layer intact. This directional etching carves out trenches, vias or holes in the exposed horizontal substrate surface sections not protected by an essentially intact deposited layer or multi-layer or buttress material. Finally, the deposited layer (or multi-layer) and buttress material, if any, is removed from the substrate leaving behind a substrate containing sub-half-micron trenches, vias or holes.

These and other objects and advantages of the claimed invention may be readily ascertained by referring to the following detailed description and examples of preferred embodiments.

DETAILED DESCRIPTION OF THE PREFERRED EMBODIMENTS

The following detailed description of the preferred embodiments is provided to aid those skilled in the art of practicing the present invention. However, the following detailed description of the preferred embodiment should not be construed to unduly limit the present invention. Variations and modifications in the embodiments discussed may be made by those of ordinary skill in the art without departing from the scope of the present invention.

Figure 1:
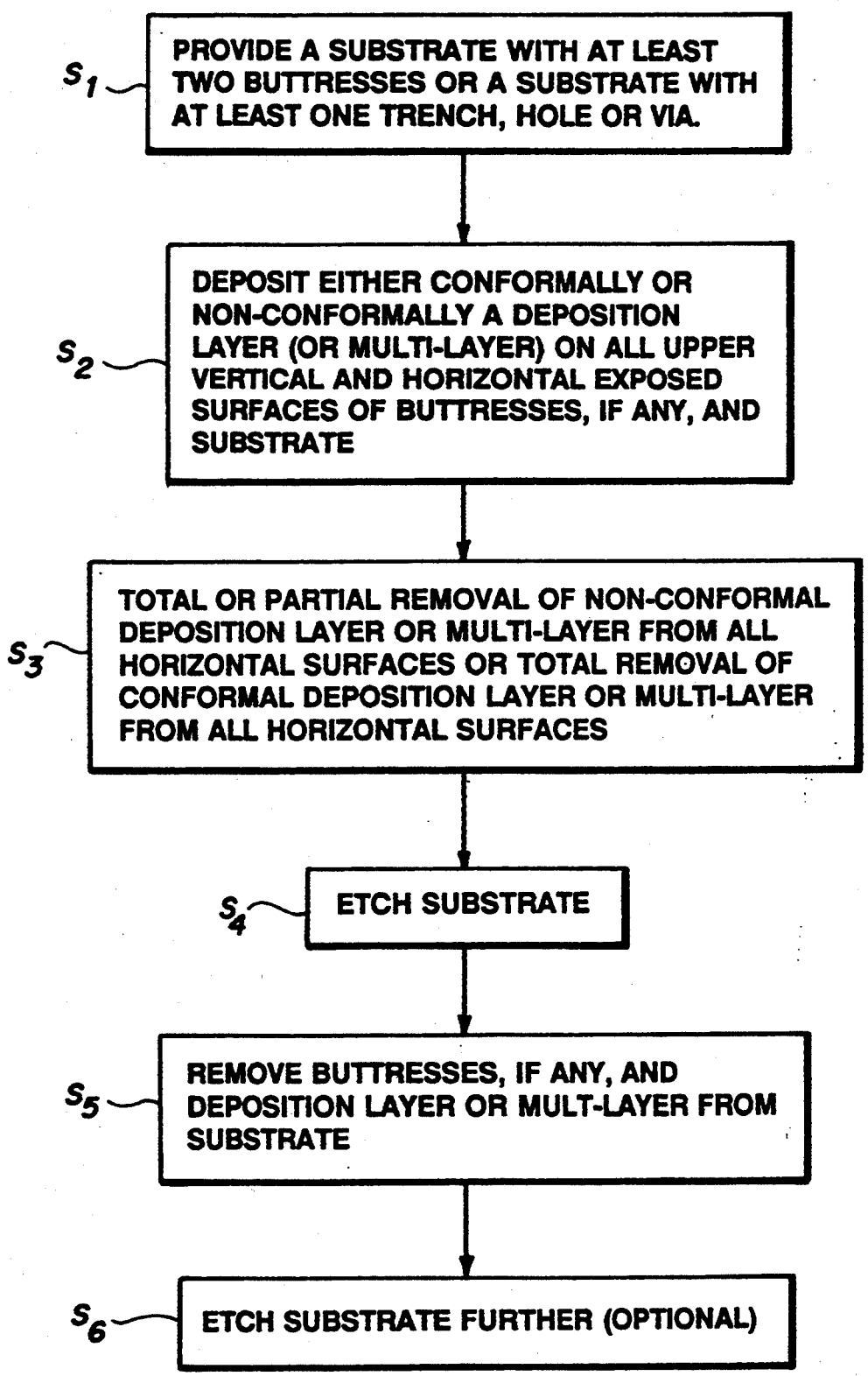
FIG. 1 is a flow chart showing the sub-half-micron dimension trench, via and/or hole fabrication process of a preferred embodiment of the present invention.
Figure 2A:
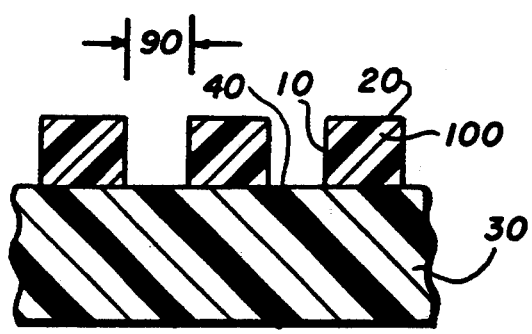
FIG. 2a depicts a cross-sectional view of the substrate with at least two buttresses attached.
Figure 6A:
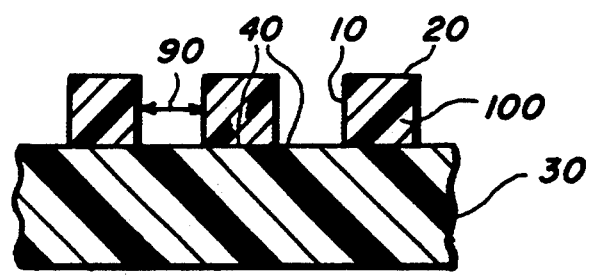
FIG. 6a depicts a cross-sectional view of another substrate with at least two buttresses thereon.

Referring to FIG. 2a (conformal deposition on buttresses) and FIG. 6a (non-conformal deposition on buttresses), at the start of the sub-half-micron trench and-/or hole formation/fabrication process of the present invention (step S1 of FIG. 1), at least two buttresses 100 are formed on a first horizontal surface 40 of substrate 30. The buttresses 100 could alternatively be prefabricated separately and subsequently placed on first horizontal surface 40 of substrate 30. In the case of prefabricated buttresses, preferably, a template of buttresses 100 are held in place on top of substrate 30 with spring loaded microclips clips (not shown). Several examples of buttress templates are shown in FIGS. 7a, 7b, 8a, 8b, 9 and 10. Alternatively, sufficient glue, adhesive material or other bonding material (not shown) could be applied to the peripheral regions of the buttress template. For example, suitable glues include silver paint and photoresist materials. The shape of the openings within the template can be of any desired shape including irregular shapes and do not necessarily have to define squares, rectangles or circles as shown in FIGS. 7a, 7b, 8a, 8b, 9 and 10. A minimal amount of glue, adhesive material or bonding material is preferred to avoid interference with any conformal or non-conformal deposition (see step S2 of FIG. 1). For example, excess glue can occlude openings, cause shifting of the template, or form a glue layer which is susceptible to fracture. Substrate 30 is selected from materials including a semiconductor such as silicon (Si), gallium arsenide (GaAs), an insulator such as silicon dioxide (SiO$_2$), or a metal such as Cu or W.

Figure 2B:
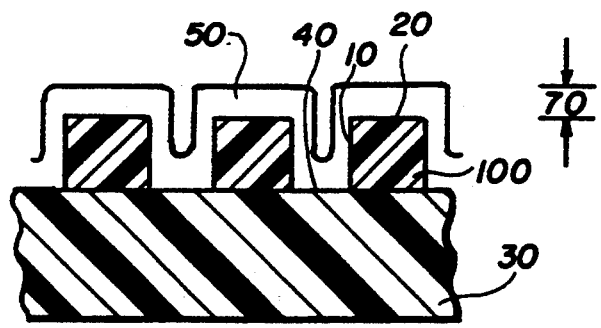
FIG. 2b depicts a substrate whereon a conformal deposition layer has been deposited onto the surfaces of the substrate and buttresses thereon.
Figure 2C:
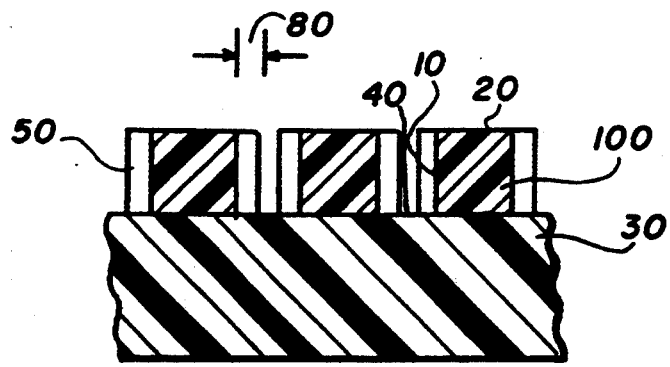
FIG. 2c depicts a substrate with buttresses where the conformal deposition layer has been removed from the horizontal surfaces.
Figure 2D:
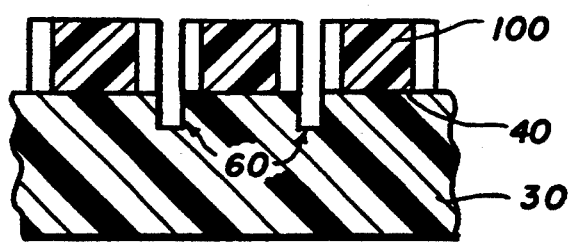
FIG. 2d depicts a substrate and buttresses from FIG. 2c which have been etched directionally to form a trench or a hole or a via and FIG. 2e depicts a cross-sectional view of the substrate from FIG. 2d where the conformal deposition layer and buttresses have been removed from the substrate surfaces leaving only the trenches or holes or vias etched into the substrate.
Figure 2E:
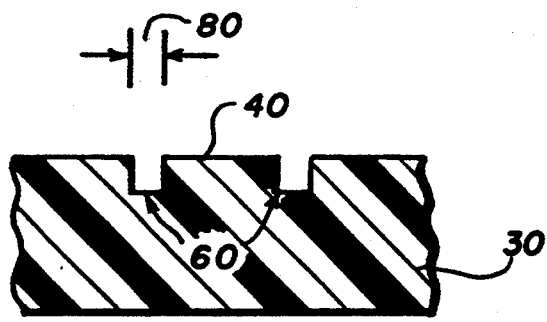
Figure 6B:
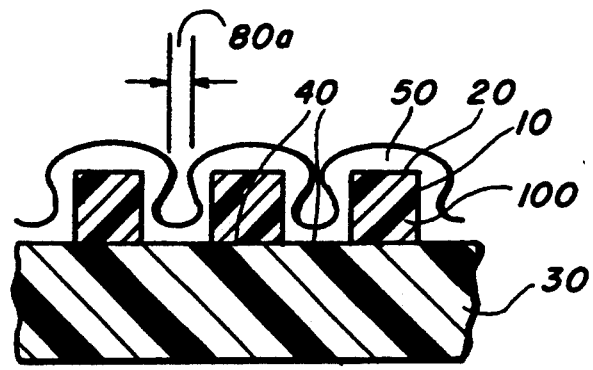
FIG. 6b depicts a substrate and buttresses whereon a non-conformal deposition layer has been deposited onto the surfaces of the substrate and buttresses.
Figure 6C:
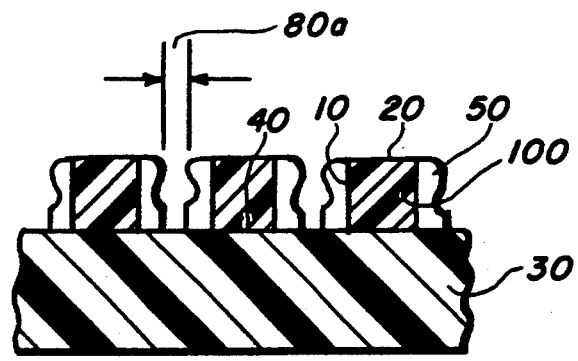
FIG. 6c depicts a substrate with a non-conformal deposition layer where the non-conformal deposition layer has been removed from the horizontal surfaces of the buttresses and substrate down to the horizontal surface of the substrate.
Figure 6D:
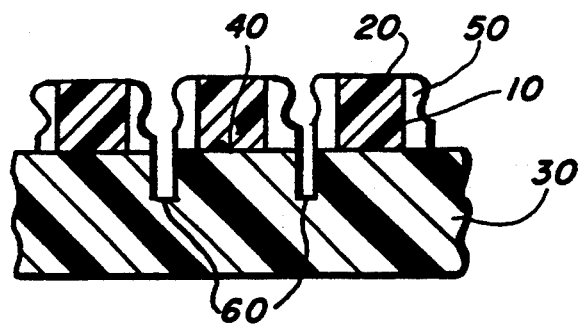
FIG. 6d depicts a substrate from FIG. 6c or FIG. 6f which has been etched directionally to form a trench or a hole or via.
Figure 6E:
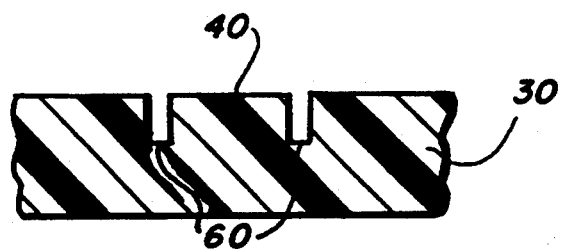
FIG. 6e depicts a cross-sectional view of the substrate from FIG. 6d where the non-conformal deposition layer has been removed from the vertical surfaces and the buttresses have also been removed.
Figure 6F:
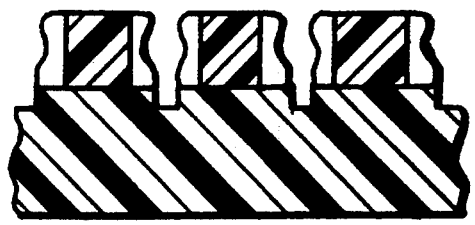
FIG. 6f depicts a substrate with a non-conformal deposition layer where the non-conformal deposition layer has been removed from the horizontal surfaces of the buttresses and substrate down to and below the horizontal surface of the substrate.

If removable templates (see FIGS. 7a, 7b, 8a, 8b, 9 and 10) are used, for example, in FIGS. 2d and 6d, removal of those templates would yield the substrates as depicted in FIGS. 2e and 6e, respectively. The removable templates appear as shown in FIGS. 7a, 7b, 8a, 8b, 9 and 10. These templates can be reused on a new substrate, for example, with glue or microclips (not shown), as previously described, without having to repeat steps S1, S2, and S3 of FIG. 1, thereby, increasing the efficiency of this inventive process and reducing its cost.

Referring to FIG. 2a (conformal deposition on buttresses) and FIG. 6a (non-conformal deposition on buttresses), at least two buttresses 100, having essentially vertical surfaces 10 and essentially horizontal surfaces 20 with an interbuttress distance shown as 90 from about 1.0 μm to about 0.5 μm are advantageously formed using conventional lithographic fabrication techniques, for example, photolithography. Buttress 100 is selected from materials including silicon (Si), silicon dioxide (SiO$_2$), metal oxides, glasses, polyimides and photoresists. A cross-sectional view of the work piece thus formed is shown in FIG. 2a and FIG. 6a.

Figure 3A:
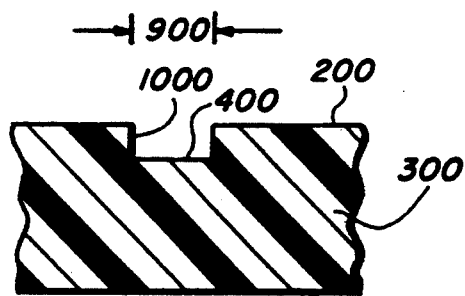
FIG. 3a depicts a cross-sectional view of another substrate with at least one hole, via or trench cut into the substrate.
Figure 5A:
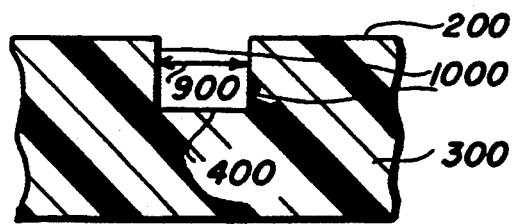
FIG. 5a depicts a cross-sectional view of another substrate with at least one hole, via or trench cut into the substrate.

Alternatively, referring to FIG. 3a (conformal deposition on hole, trench or via) and FIG. 5a (non-conformal deposition on hole, trench or via), at least one hole, trench or via having vertical surfaces 1000 and a horizontal surface 400 is cut into the first horizontal surface 200 of the substrate 300. The hole or trench (i.e. via), depicted in FIG. 3a and FIG. 5a, has a diameter of about 1.0 μm to about 0.5 μm or a width of about 1.0 μm to about 0.5 μm, respectively, denoted as 900. The hole, via or trench depicted in FIG. 3a and FIG. 5a is formed using conventional lithographic fabrication techniques, for example, photolithography.

During step S2 (see FIG. 1), as shown in FIG. 2b (conformal deposition on buttresses), a deposition layer 50 is formed on surfaces 10, 20, and 40 having a uniform thickness shown as 70. In other words, deposition layer 50 is conformally deposited on surfaces 10, 20, and 40. Preferably, the deposition layer 50 is formed by depositing a small grain size metal or other material via thermal decomposition of a metal containing precursor material or other suitable precursor material.

Alternatively, during step S2 (see FIG. 1), as shown in FIG. 6b (non-conformal deposition on buttresses), a deposition layer 50 is formed on surfaces 10, 20, and 40 having a non-uniform thickness. In other words, deposition layer 50 is non-conformally deposited on surfaces 10, 20, and 40. Preferably, the deposition layer 50 is formed by depositing a small grain size metal or other material via thermal decomposition of a metal containing precursor material or other suitable precursor material.

Figure 3B:
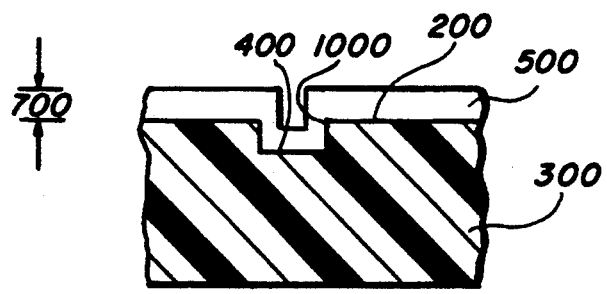
FIG. 3b depicts a substrate whereon a conformal deposition layer has been deposited onto the substrate.

During step S2 (see FIG. 1), as shown in FIG. 3b (conformal deposition on hole, trench or via), a deposition layer 500 is formed on surfaces 1000, 200 and 400 having a uniform thickness shown as 700. In other words, deposition layer 500 is conformally deposited on surfaces 1000, 200 and 400. Preferably, the layer 500 is formed by depositing a small grain size metal or other material via thermal decomposition of a metal containing precursor gas or other suitable precursor gas.

Figure 5B:
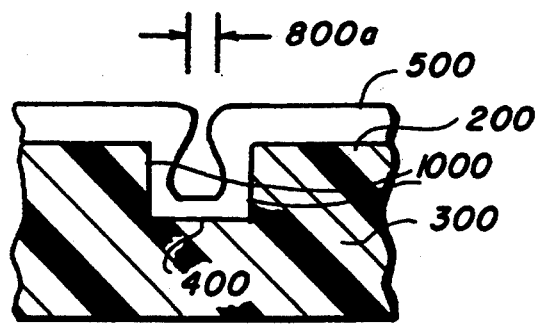
FIG. 5b depicts a substrate whereon a non-conformal deposition layer has been deposited onto the substrate.

Alternatively, during step S2 (see FIG. 1), as shown in FIG. 5b (non-conformal deposition on hole, trench or via), a deposition layer 500 is formed on surfaces 1000, 200 and 400 having a non-uniform thickness. In other words, deposition layer 500 is non-conformally deposited on surfaces 1000, 200 and 400. Preferably, the layer 500 is formed by depositing a small grain size metal or other material via thermal decomposition of a metal containing precursor gas or other suitable precursor gas.

The deposition layers 50 or 500 may be formed by conformally depositing a single material to a thickness shown as 70 (see FIG. 2b; conformal deposition on buttresses) or 700 (see FIG. 3b; conformal deposition on hole, trench or via) or by depositing multi-layers (not shown) of a metal, a semiconductor, an insulator and, mixtures thereof to a final conformal thickness shown as 70 or 700. Alternatively, the deposition layers 50 or 500 may be formed by non-conformally depositing a single material (see FIG. 6b—non-conformal deposition on buttresses and FIG. 5b—non-conformal deposition on hole, trench or via) or by depositing multi-layers (not shown) of a metal, a semiconductor, an insulator and mixtures thereof.

To form conformal deposition layers or multi-layers (not shown), for example, 50 and 500, as depicted in FIGS. 2b and 3b, respectively, an appropriate precursor gas is selected. The conformal deposition layer or multi-layer (not shown), 50 or 500 (see FIG. 2c or FIG. 3c, respectively), thus formed, are selected so that they protect portions of the substrate, 30 or 300, directly underneath the layers 50 or 500, from being etched, under subsequent etching conditions (step S4, see FIG. 1), when exposed portions of the substrate, 30 or 300, are subsequently etched in step S4. Under etching conditions, the bare, exposed substrate surface 40 or 400 (see FIG. 2c or FIG. 3c, respectively) is selectively etched while leaving the conformal layer 50 or 500 and the substrate directly underneath such conformal layer essentially intact.

Figure 5C:
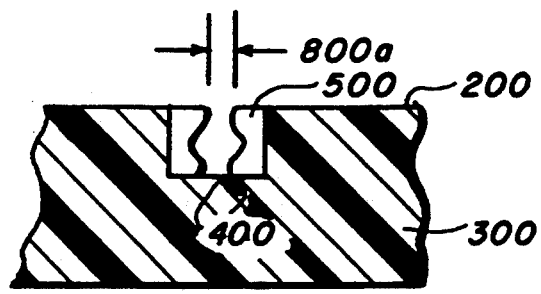
FIG. 5c depicts a substrate with a non-conformal deposition layer where the non-conformal deposition layer has been removed from the horizontal surfaces.

Alternatively, to form a non-conformal deposition layer or multi-layer (not shown), for example, 50 and 500 as depicted in FIGS. 6b (non-conformal deposition on buttresses) and 5b (non-conformal deposition on hole, trench or via), respectively, an appropriate precursor gas is selected. The non-conformal deposition layer or multi-layer (not shown), 50 or 500 (see FIG. 6c or FIG. 5c, respectively), thus formed, are selected so that they protect portions of the substrate, 30 or 300, directly underneath layers 50 or 500, from being etched, under subsequent etching conditions (step S4, see FIG. 1), when exposed portions of the substrate, 30 or 300, are subsequently etched in step S4. Under etching conditions of step S4, the bare, exposed substrate surface 40 or 400 (see FIG. 6c or FIG. 5c, respectively) is selectively etched while leaving the non-conformal layer 50 or 500 and the substrate directly underneath such non-conformal layer essentially intact.

The deposition layer or multi-layer (not shown), whether conformal or not, is deposited to protect the substrate directly underneath the deposited layer or multi-layer (not shown) from being etched when the unprotected substrate (i.e. that portion of the substrate not covered by a deposited layer or multi-layer (not shown) or a buttress) is etched in subsequent step S4. Non-conformal deposition of a single layer or multi-layer is achieved when the narrow conditions for conformal deposition are not met. Deposition layer material which etches at a rate much faster than the etching rate of an exposed portion of the substrate would be unsuitable for use with the present inventive process. However, a deposition layer material which etches at a rate slower or even much slower than the etching rate of an exposed portion of the substrate is suitable for use with the present inventive process. The variations in the depth of a trench or a hole etched into the substrate when there is a variation between the etching rate of the deposition layer material and the etching rate of the bare, unexposed substrate sections can be described by referring to FIGS. 2f, 3g, 5g and 6g. Each of FIGS. 2f, 3g, 5g and 6g show two dimensions labeled h and $h_1$. The symbol h refers to the original height of the vertical portion of the deposition layer 50 or 500, whether conformal or not, before any etching during step S4 is done to cut a trench, hole, or via into the exposed portion of the substrate. The depth of a sub-half micron wide trench or hole etched during step S4 into the substrate is labeled $h_1$. During step S4, if the etching rate of the substrate is much greater than the etching rate of the deposition layer, then $h_1$ can be much greater than h. During step S4, if the etching rate of the substrate equals that of the deposition layer, then at best $h_1$ can be equal to h without increasing the width of the trench or diameter of the hole. During step S4, it the etching rate of the substrate is less than that of the deposition layer, then $h_1$ cannot be greater than h.

For example, if the substrate 30 is a semiconductor such as Si and the deposition layer 50 is Pt, the deposition layer of Pt etches much slower than does the substrate of Si under $CBrF_3$ reactive ion etching in step S4. However, if the deposition layer is Al, then it etches much faster than a substrate 30 made of, for example, Pt, under chlorine reactive ion etching in step S4. Additionally, if the deposition layer 50 is composed of Pt and the substrate composed of Al, then, under reactive ion etching with chlorine, the Pt deposition layer 50 will not significantly etch while the Al substrate 30 will be etched away by plasma etching with chlorine.

Figure 2F:
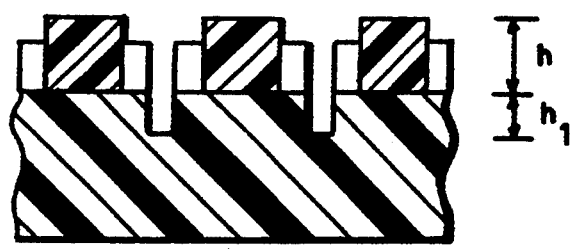
FIG. 2f, FIG. 2g and FIG. 2h depict the variations possible in FIG. 2d.
Figure 2G:
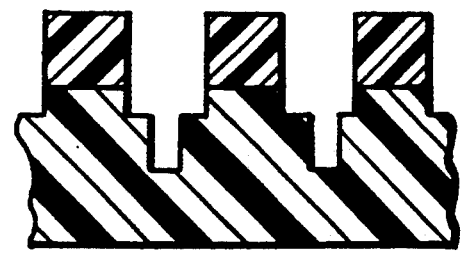
Figure 2H:
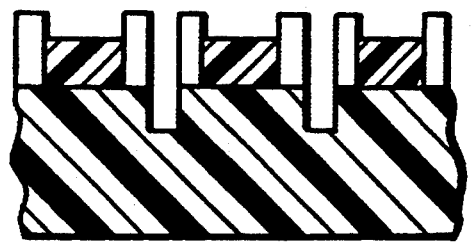
Figure 6G:
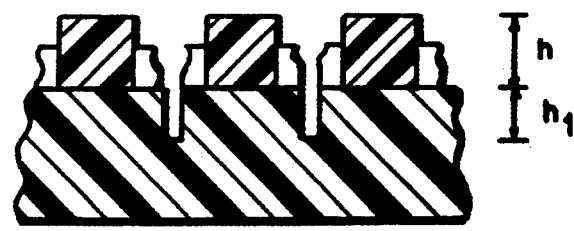
FIG. 6g, FIG. 6h and FIG. 6i depict the variations possible in FIG. 6d.
Figure 6H:
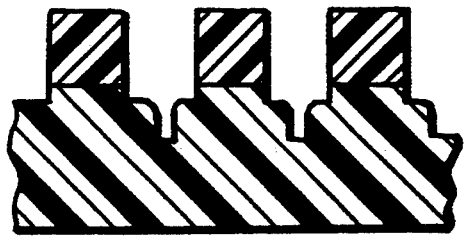
Figure 6I:
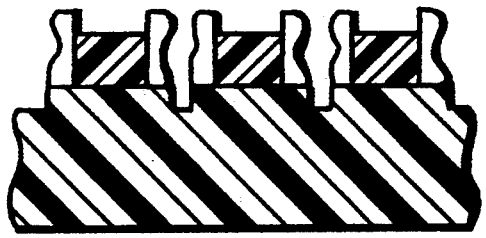
Figure 7A:
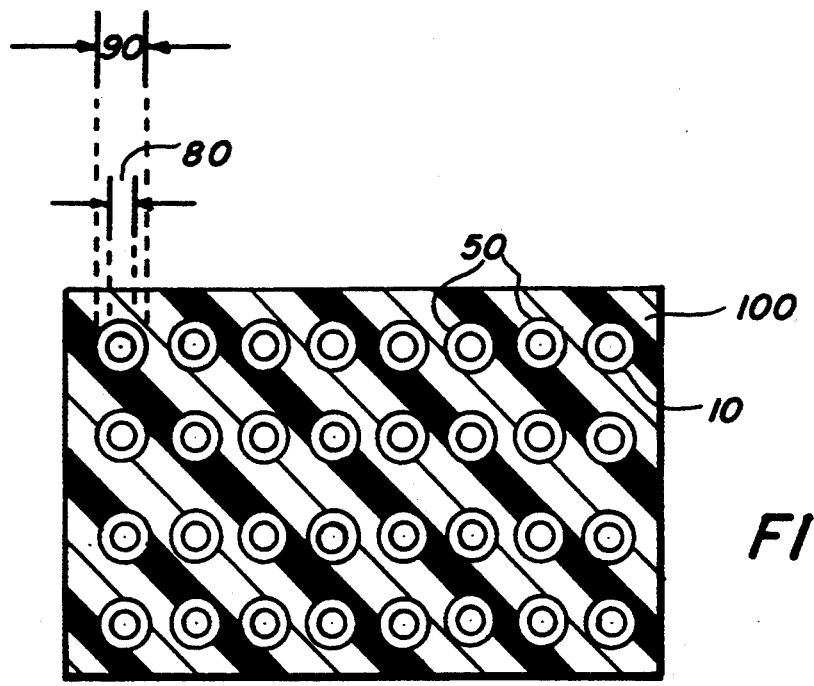
FIG. 7a and FIG. 7b depict a top view and a cross-sectional side view of a removable template structure lined with deposition layer or multi-layer (not shown) in circular openings cut out of the buttress material within the template.
Figure 7B:
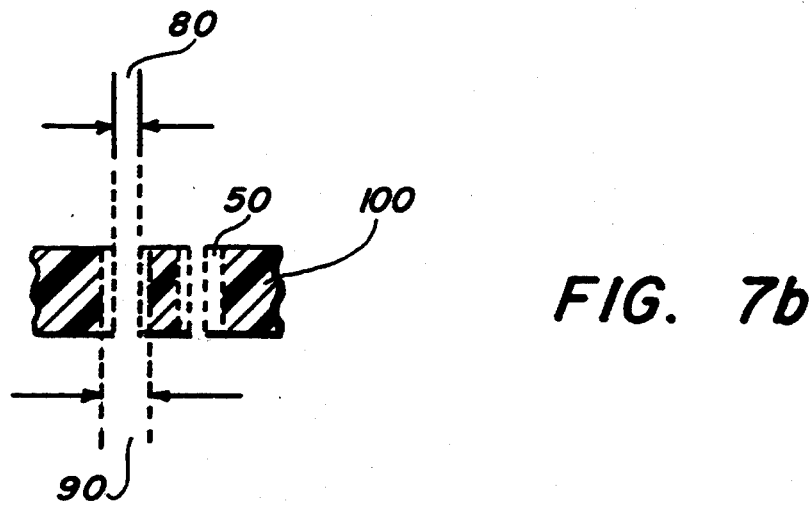
Figure 8A:
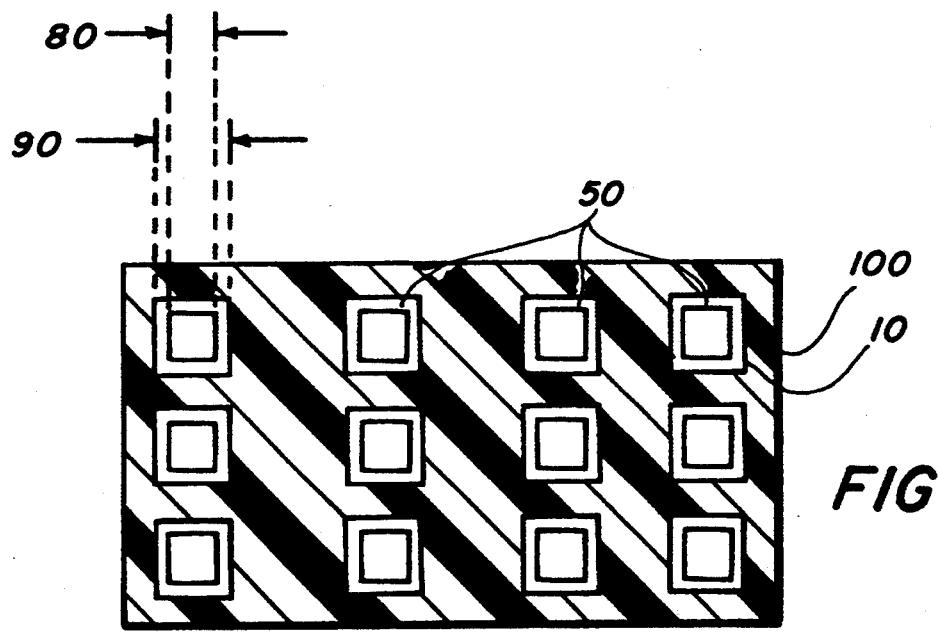
FIG. 8a and FIG. 8b depict a top view and a cross-sectional side view of a removable template structure lined with deposition layer or multi-layer (not shown) in square or rectangular openings cut out of the buttress material within the template.
Figure 8B:
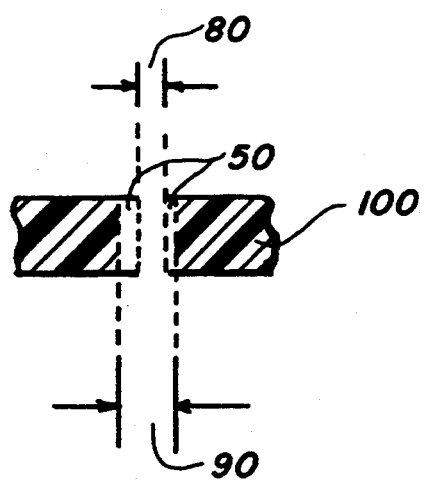
Figure 9:
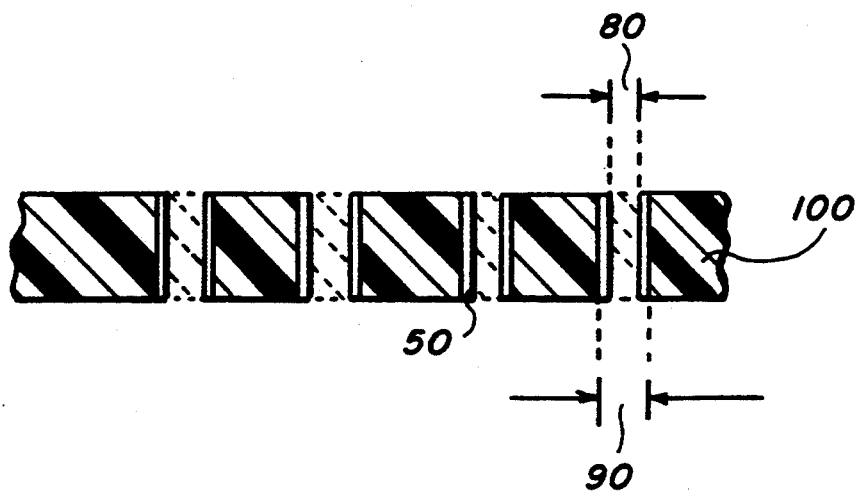
FIG. 9 is a cross-sectional view side view of a removable buttress template having attached to it a single layer or multi-layer deposited on the vertical portions of the buttresses which are contained within the template wherein the layer or multi-layer has been conformally deposited to give a layer of a uniform thickness.
Figure 10:
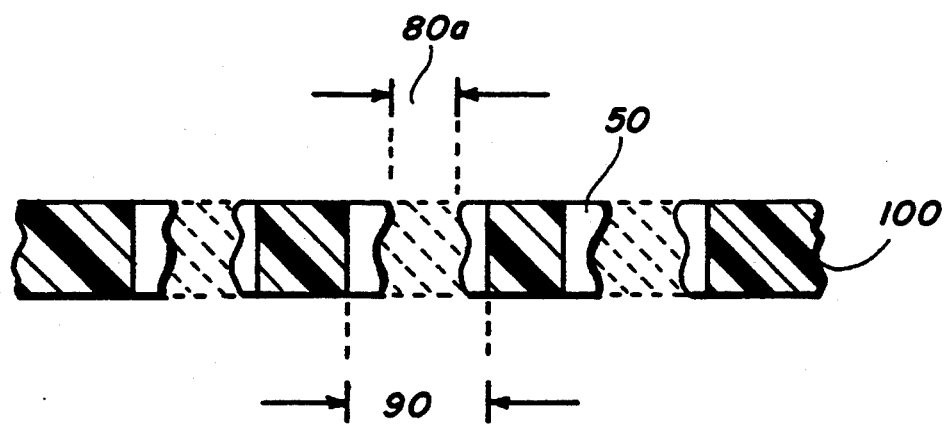
FIG. 10 is a cross-sectional view side view of a removable buttress template having attached to it a single layer or multi-layer deposited on the vertical portions of the buttresses which are contained within the template wherein the layer or multi-layer has been non-conformally deposited to give a layer of non-uniform thickness.

FIG. 2f and FIG. 6g depict the etching away of the deposition layer as well as the substrate while leaving the buttresses intact. FIG. 2g and FIG. 6h depict the result of having etched away all the deposition layer and then further etching into the substrate. FIG. 2h and FIG. 6i depict a situation where the buttress and the substrate is etched while leaving the deposition layer intact.

Figure 3C:
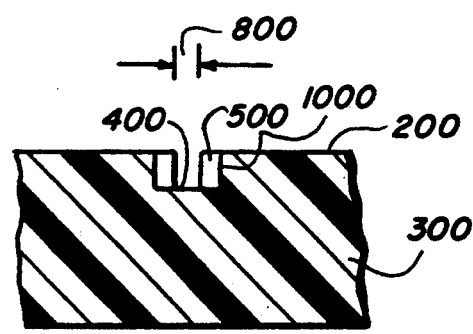
FIG. 3c depicts a substrate with a conformal deposition layer where the conformal deposition layer has been removed from the horizontal surfaces.
Figure 3D:
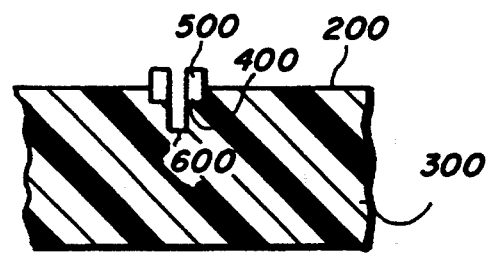
FIG. 3d depicts a substrate from FIG. 3c which has been etched directionally to form a narrower trench or hole or via.
Figure 3E:
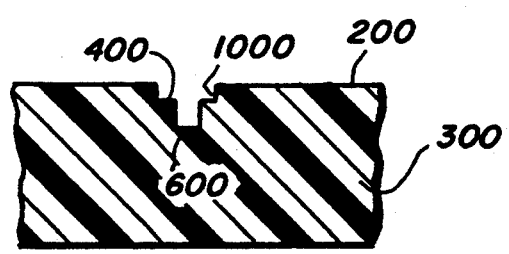
FIG. 3e depicts a cross-sectional view of the substrate from FIG. 3d where the conformal deposition layer has been removed from the vertical surfaces and FIG. 3f depicts the substrate of FIG. 3e where an upper layer of the substrate has been removed leaving only the narrower trench or hole or via etched into the substrate.
Figure 3F:
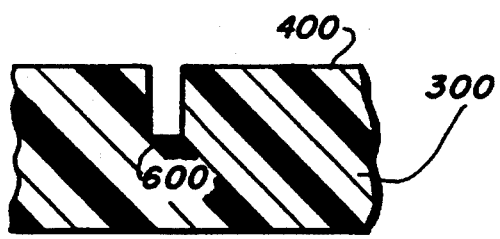
Figure 3G:
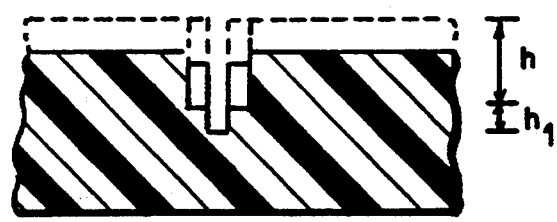
FIG. 3g, FIG. 3h and FIG. 3i depict the variations possible in FIG. 3d.
Figure 3H:
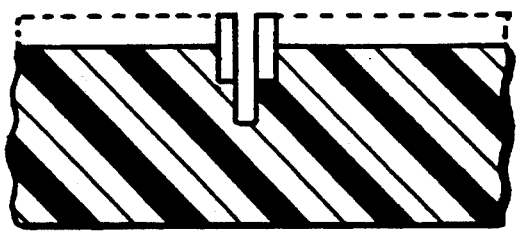
Figure 3I:
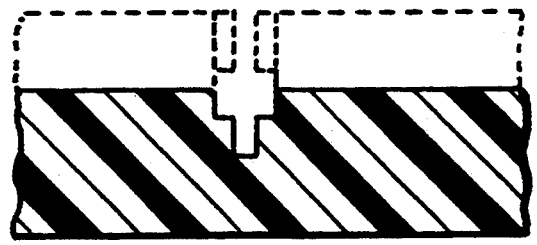
Figure 5D:
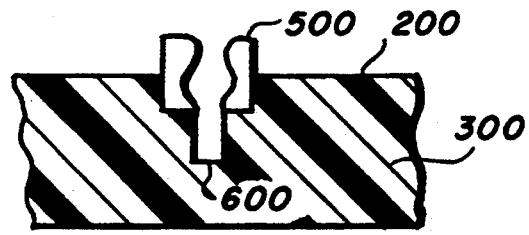
FIG. 5d depicts a substrate from FIG. 5c which has been etched directionally to form a narrower trench or hole or via.
Figure 5E:
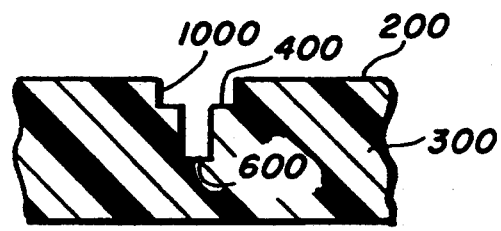
FIG. 5e depicts a cross-sectional view of the substrate from FIG. 5d where the non-conformal deposition layer has been removed from the vertical surfaces and FIG. 5f depicts the substrate of FIG. 5e where an upper layer of the substrate has been removed leaving only the narrower trench or hole or via etched into the substrate.
Figure 5F:
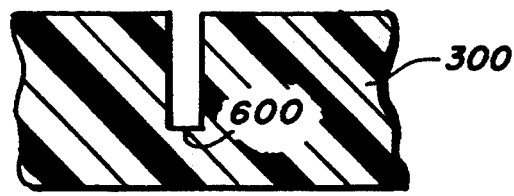
Figure 5G:
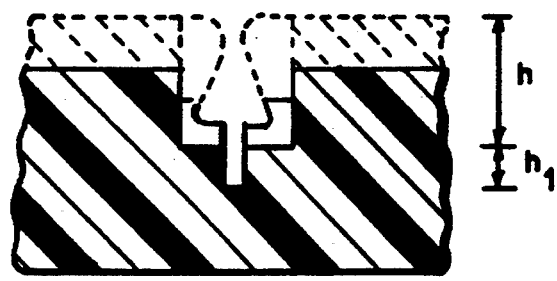
FIG. 5g, FIG. 5h and FIG. 5i depict the variations possible in FIG. 5d.
Figure 5H:
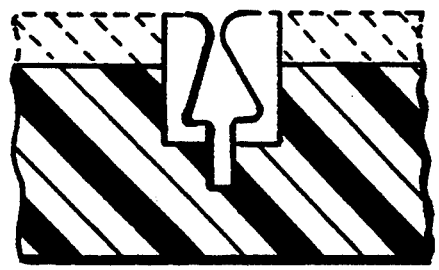
Figure 5I:
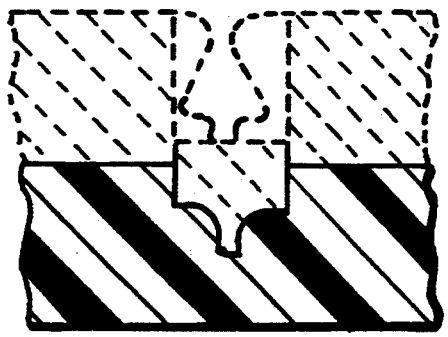

FIG. 3g and FIG. 5g depict the etching away of the deposition layer as well as the substrate. FIG. 3h and FIG. 5h depict the etching away of the substrate while leaving the deposition layer intact. FIG. 3i and FIG. 5i depict the result of having etched away all the deposition layer and then further etching into the substrate.

For depositing a metal deposition layer, during step S2, a precursor gas material includes a metal ligand complex, a metal hydride, a metal alkyl, a silane, or a metal halide. Preferably, a volatile metal-containing precursor gas is selected from inorganic metal coordination compounds or organometallic coordination compounds, including metal carbonyls. Precursor gas molecules advantageously contain ligands, e.g. $PF_3$, surrounding a metal atom such as platinum (Pt), thereby forming a precursor gas, for example, $Pt(PF_3)_4$. Suitable metal precursors include metals coordinated to trifluorophosphene (i.e. $PF_3$), or to carbonyl ligands (i.e. CO), or to alkyl ligands. For example, such metal ligand compounds include $Pt(PF_3)_4$, $Ni(PF_3)_4$, $Pd(PF_3)_4$, $Fe(PF_3)_5$, $W(PF_3)_6$, $Cr(PF_3)_6$, $Mo(PF_3)_6$, $Co(PF_3)_6$, $Ru(PF_3)_5$, $Rh_2(PF_3)_8$, $Rh(PF_3)_5$, $Re_2(PF_3)_{10}$, $Ir_2(PF_3)_8$, $Ni(CO)_4$, $Fe(CO)_5$, $W(CO)_6$, $Cr(CO)_6$, $Mo(CO)_6$, $CO_2(CO)_8$, $Ru(CO)_5$, $Os(CO)_5$, $(CH_3)_2AlH$, triisobutyl aluminum and (trimethylvinylsilyl)hexafluoro-acetylacetonate copper I and mixtures thereof.

During step S2, the deposition layer or multi-layer (not shown) 50 or 500 (see FIGS. 2b, 3b, 5b and 6b) may be formed by conformally or non-conformally depositing any of the following suitable materials including a metal, a semiconductor, or an insulator. Suitable semiconductors for deposition of layers 50 and 500 include Si, Ge and GaAs. Precursor materials for depositing Si in layers 50 or 500 include silanes, chlorosilanes and mixtures thereof. Precursor materials for depositing Ge in layers 50 or 500 include $GeH_4$. Precursor materials for depositing GaAs layers 50 or 500 include a mixture of an alkyl gallium and $AsH_3$ or substituted arsines.

Suitable insulators for deposition of layers 50 and 500 (see FIGS. 2b, 3b, 5b and 6b) include $SiO_2$, $Si_3N_4$ and $Al_2O_3$. Precursor materials for depositing $SiO_2$ in deposition layers 50 or 500 includes a mixture of a silane and an oxidant. depositing $Si_3N_4$ in layers 50 or 500 include a silane and a nitriding compound such as ammonia, or a substituted silane and a nitriding compound, or a mixture of silanes and a nitriding compound, or substituted silanes and a nitriding compound. Precursor materials for depositing $Al_2O_3$ in layers 50 or 500 include an alkyl or substituted alkyl aluminum and an oxidant. For deposition of insulators, for example, $SiO_2$, $Si_3N_4$, and $Al_2O_3$, in deposition layers 50 or 500, a plasma chemical vapor deposition technique is preferred.

Figure 4:
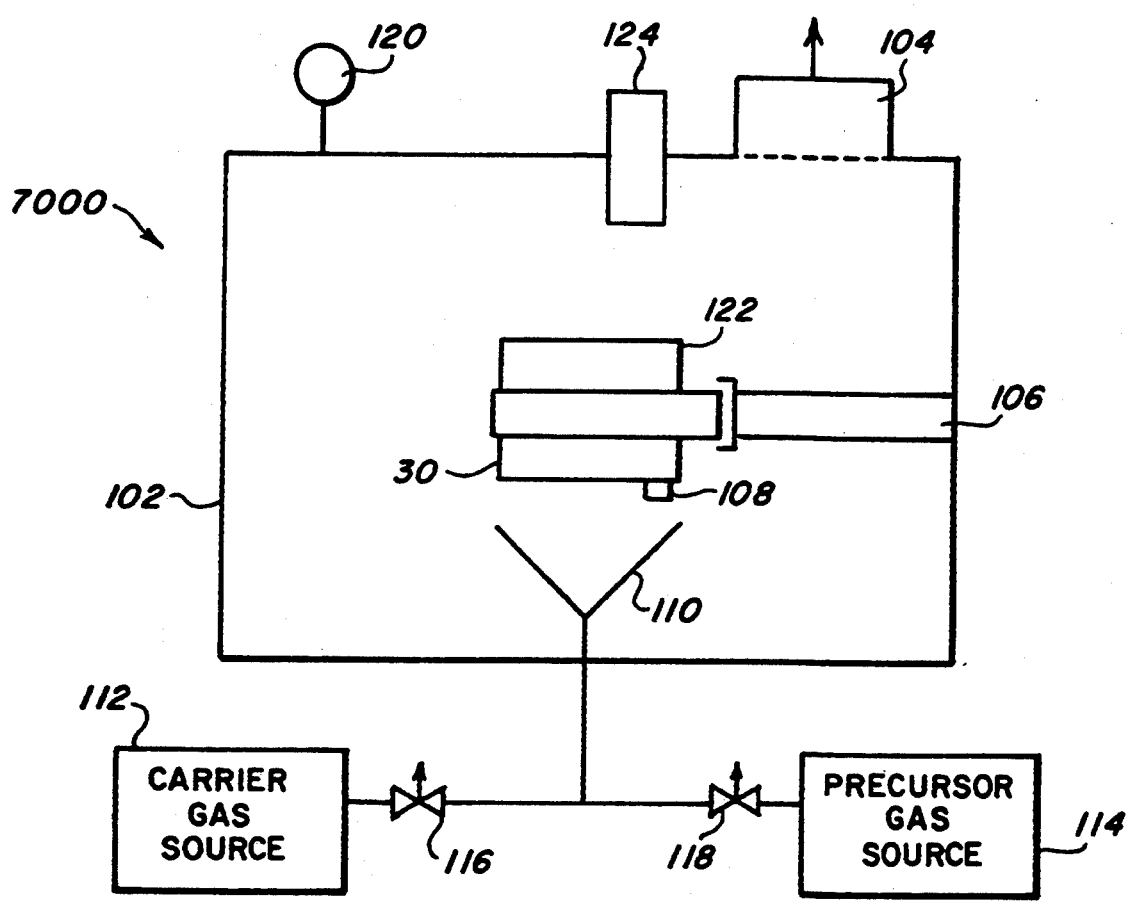
FIG. 4 is a schematic diagram showing a vacuum reactor suitable for implementing steps S1, S2, S3, S4, S5 and S6 of the flowchart of FIG. 1.

With regard to the deposition of metal in deposition layer 50 (FIGS. 2b and 6b) or deposition layer 500 (FIGS. 3b and 5b) the deposition is preferably performed in a high vacuum reactor or an ultra high vacuum reactor 7000, depicted in FIG. 4, under, for example, very low metal containing precursor and carrier gas pressure conditions, unlike those in conventional CVD reactors. Nevertheless, in some circumstances, pressures up to about 1 atm (about 760 Torr) or less may also be suitable for carrying out the layer deposition (conformal or non-conformal deposition) step of the presently claimed inventive process.

Referring to FIG. 4, an exemplary vacuum reactor 7000 is shown comprising a vacuum chamber 102 containing a pump 104 vented to the outside, a manipulator 106 for positioning and supporting substrate 30 (FIGS. 2a and 6a) or 300 (FIGS. 3a and 5b), a temperature sensor 108 for sensing the temperature of the substrate 30 or 300 and a doser 110. Doser 110 is connected to carrier gas source 112 and precursor gas source 114 via metering valves or flow controllers 116 and 118, respectively. Preferably, the diameter of doser 110 is substantially equal to the diameter of the work piece, i.e. substrate 30 or 300. An ion gun 124 can be installed on the same chamber for sputtering and ion-assisted etching. A conventional ionization gauge 120 is connected to chamber 102 for measuring the partial pressures of the precursor and carrier gases. Manipulator 106 advantageously includes a conventional resistive heater 122 for controlling the temperature of substrate 30 or 300. Manipulator 106 may be rotated along its long axis such that the substrate 30 or 300 can be oriented towards the ion gun 124. Preferably, pump 104 is a conventional cryo-trapped diffusion pump or a turbo-molecular pump.

During step S2 (see FIG. 1), for example, a volatile metal-containing precursor gas and carrier gas from closer 110 effusively flow onto substrate 30 or 300 at flow rates metered by valves or flow controllers 116 and 118, respectively, while pump 104 maintains chamber 102 at a predetermined partial pressure. It will be appreciated that the use of volatile metal-containing precursor gases advantageously provide a highly uniform film, subject to limitations from nucleation and growth characteristics inherent to the particular metal-substrate system, due to the enhanced ability of a precursor gas to diffuse and scatter on the surfaces 10, 20 and 40 in FIG. 2a and on surfaces 200, 400 and 1000 in FIG. 3a of the substrate 30 and 300, respectively. It will be further appreciated that careful selection of, for example, a volatile metal-containing precursor gas and control of the environment in the vacuum reactor 7000 (see FIG. 4) are required to fabricate the uniform (i.e. conformal) deposition layers 50 and 500 (see FIGS. 2b and 3b, respectively) in both the vertical and horizontal orientation with respect to the substrate surface 20 or 200, respectively.

Suitable carrier gases include the gases helium (He), neon (Ne), argon (Ar), krypton (Kr), xenon (Xe), hydrogen ($H_2$), nitrogen ($N_2$) and mixtures thereof. Hydrogen prevents oxidation and removes surface oxidation at the substrate surface. Preferably, the carrier gas is hydrogen.

The total pressure of the carrier and precursor gases is typically less than about 760 Torr, preferably less than 100 Torr, more preferably less than 1 Torr and most preferably less than $10^{-3}$ Torr. The partial pressure of the precursor gas is typically less than or equal to 50% of the total pressure, preferably less than or equal to 35% of the total pressure, more preferably less than or equal to 20% of the total pressure and most preferably less than or equal to 10% of the total pressure of the carrier and precursor gases.

During step S2 (see FIG. 1), substrate 30 or 300 is maintained at a predetermined temperature using sensor 108 and heater 122. For example, deposition of a metallic layer 50 or 500 on substrate 30 or 300, respectively, and on buttress 100 is a thermal decomposition process employing effusive molecular beam conditions. Therefore, deposition of a metallic layer 50 or 500 on substrate 30 or 300 is dependent on the partial pressure of the precursor and carrier gases as well as on the temperature of the substrate 30 or 300.

The substrate 30 or 300 is maintained at a temperature sufficient for the deposition of a conformal layer 50 or 500 on substrate 30 or 300 and on buttress 100, if any, as depicted in FIGS. 2b and 3b. For example, the deposition rate of layer 50 or 500 is controlled by the substrate temperature. For Pt, temperatures below about 230° C. result in a deposition rate too low for effective processing. Temperatures above about 300° C. produce high deposition rates, but also result in the formation of silicides in layers 50 or 500. The silicides are produced by reaction of, for example, the precursor metal with, for example, the silicon in substrates 30 or 300 at the contacting surfaces 40, 200, 400, and 1000. Platinum silicide formation is suppressed by selecting a processing temperature below about 300° C. When metal silicide formation is allowable, higher substrate temperatures can be used. In general, for deposition of metallic layers 50 or 500, typically the substrate temperature is maintained between about 150° C. to about 800° C., preferably between about 200° C. to about 650° C., more preferably between about 230° C. to about 350° C. and most preferably between about 270° C. to about 300° C.

The resulting structures are shown in FIGS. 2b and 3b wherein metal layers 50 and 500, respectively, have been conformally deposited on the substrate. The critical step in forming sub-half-micron trenches, vias, or holes is the formation of layers 50 or 500 of thickness equal to 70 or 700, respectively. If one begins with an interbuttress distance of 90, as depicted in FIG. 2a, or a trench width (or hole diameter or via diameter) 900, as depicted in FIG. 3a, of between about 1.0 $\mu$m to about 0.5 $\mu$m, and forms a conformal layer 50 or 500 on the exposed layers of the substrate and buttress, if any, then one reduces the interbuttress width 90 by twice the layer width ($2 \times 70$) and the trench width 900 by twice the layer width ($2 \times 700$). A suitable conformal layer width 70 or 700 is selected such that the new interbuttress width $[90 - (2 \times 70)]$ or the trench width $[900 - (2 \times 700)]$ is on the order of about 0.5 $\mu$m to about 0.03 $\mu$m, respectively.

During step S3, the portion of the conformal layer 50 or 500 on the horizontal surfaces 20 and 40 of the substrate 30, as depicted in FIG. 2b and on the horizontal surfaces 200 and 400 of substrate 300, as depicted in FIG. 3b, is removed. The removal of the conformal layer from the horizontal surfaces is accomplished by conventional anisotropic or directional etching methods, i.e. directional ion beam sputtering or RIE, thereby producing the structure shown in FIGS. 2c and 3c. Because layer 50 is conformally deposited, the removal of such layer from the horizontal surfaces ensures that when the buttress surface 20 is exposed the substrate surface 40 is also exposed, as depicted in FIG. 2c. Likewise, because layer 500 is conformally deposited, the removal of such layer from the horizontal surfaces ensures that when the substrate surface 200 is exposed the substrate surface 400 is also exposed, as depicted in FIG. 3c. Further, since anisotropic or directional etching methods are used, the conformal layers 50 and 500, depicted in FIGS. 2c and 3c, respectively, remain intact and in contact with the buttress vertical surfaces 10 depicted in FIG. 2c and trench vertical surfaces 1000 depicted in FIG. 3c. The presence of the intact conformal layers in contact with the vertical surfaces reduces the interbuttress distance from 90, depicted in FIG. 2a, to 80, depicted in FIG.2c. The gap shown as 80 is equal to the interbuttress distance shown as 90 minus twice the thickness shown as 70 of the conformal layer 50 (see FIG. 2c and 2d). Similarly, the presence of the intact conformal layers in contact with the vertical surfaces reduces the trench width, (via diameter or hole diameter) from 900, depicted in FIG. 3a, to 800, depicted in FIG. 3c. The gap shown as 800 is equal to the trench width (via diameter or hole diameter) distance shown as 900 minus twice the thickness shown as 700 of the conformal layer 500 (see FIG. 3c and 3d).

With the conformal deposition process, a deposition layer 50 or 500 of thickness shown as 70 or 700, respectively, is conformally deposited on the substrate 30 or 300, respectively. The original interbuttress distance shown as 90 is reduced by twice the deposition layer thickness shown as 70 and the original trench width (hole diameter or via diameter) shown as 900 is reduced by twice the deposition layer thickness shown as 700. In both cases, the resulting gap shown as 80 or 800 is equal to the narrowest width left open between the nearest adjacent vertical portions of the deposition layer 50 or 500, (see FIGS. 2c and 3c), respectively. The subsequent trench, hole or via etched during step S4 into the substrate (see change from FIG. 2c to FIG. 2d—for conformal deposition layer on buttresses; and see change from FIG. 3c to FIG. 3d—for conformal deposition layer on trenches, holes or vias) has a width or diameter, respectively, equal to the narrowest gap opening shown as 80 or 800 depicted in FIGS. 2c and 3c, respectively.

Likewise, with non-conformal deposition, while the deposition layer 50 or 500 (see FIGS. 5b, 5c, 6b, and 6c) does not have a uniform thickness as with the conformal deposition, the subsequent trench (hole or via) etched into the substrate during step S4 (see change from FIG. 6c to FIG. 6d—for non-conformal deposition layer on buttresses; and see change from FIG. 5c to FIG. 5d—for non-conformal deposition layer on trenches, holes or vias) has a width (or diameter) equal to the narrowest gap opening shown as 800a (see FIG. 5c) or 80a (see FIG. 6c) between the nearest adjacent vertical portions of the non-conformal deposition layer 50 or 500, respectively, present at the end of step S3.

During step S4, the critical factor is to etch away the exposed substrate while leaving the unexposed substrate portion directly below the deposition layer (multilayer—not shown), whether conformally or non-conformally deposited, and buttresses, if any, intact and protected from being etched. Step S4 is carried out by any one of several anisotropic etching techniques including ion beam assisted etching, reaction ion etching and wet etching of single crystal silicon on surfaces having a crystal orientation of 110.

During step S5, the critical factor is removing the deposition layer (or multi-layer), whether conformally or non-conformally deposited, and buttresses, if any, from the substrate without significantly altering the width or diameter of trenches, holes or vias etched into the substrate during step S4. With removable templates held on with glue (not shown) or microclips (not shown), their removal involves removing the microclips and lifting off the template (see FIGS. 7a, 7b, 8a, 8b, 9, and 10) from the surfaces 40 or 400 of the substrate (see, for example, FIGS. 2d, 3d, 5d, and 6d) or just pulling off the removable templates held on with a minimum amount of glue (not shown). In the case of fixed buttresses, removal of the buttresses, if any, is accomplished by the use of various etching techniques which are dependent on the composition of the substrate and the buttress material. Some examples of various etching techniques appropriate for a variety of substrates and buttress materials are given in the table below:

| Substrate Material | Buttress Material | Method of Etching to be used during Step S5 |
| --- | --- | --- |
| $SiO_2$ | Si | Use RIE with $CBrF_3$ etchant gas which does not attack $SiO_2$ |
| Si | $SiO_2$ | Use RIE with $CF_3H$ etchant gas which does not attack Si |
| Si | polyimides | Use oxygen plasma which attacks polyimides without attacking Si |
| Si | photoresists | Use solvent such as acetone to dissolve photoresists or use oxygen plasma which attacks photoresists |
| Si | glasses | Use HF solutions to dissolve glasses |
| Si | non-glass metal oxides | Use HF solutions |

To remove a left-over deposition layer or a multi-layer (not shown), removal is accomplished by the use of various etching techniques which are dependent on the composition of the substrate and the deposition layer or multi-layer material. Some examples of various etching techniques appropriate for a variety of substrates and deposition layer or multi-layer material are given in the table below:

| Substrate Material | Layer or Multilayer Material | Method of Etching to be used during Step S5 |
| --- | --- | --- |
| $SiO_2$ | Si | Use RIE with $CBrF_3$ etchant gas which does not attack $SiO_2$ |
| Si | $SiO_2$ | Use RIE with $CF_3H$ etchant gas which does not attack Si |
| Si | metal oxides | Use HF solutions |
| Si | metals | Use concentrated acids such as a mixture of $H_2SO_4/H_2O_2$ of !:1 by volume where the $H_2O_2$ is a 30% solution and the $H_2SO_4$ is concentrated $H_2SO_4$; Use other concentrated acids such as HF, HCl, $HNO_3$ and $H_2SO_4$ |
| Si | Pt | Aqua-regia |

Optional step S6, is carried out in a manner similar or identical to step S4 wherein the substrate is etched.

EXAMPLE 1

The starting trench structures were fabricated out of Ciba Geigy's "probimide 285," (a polyimide resist material) on top of a silicon (100) substrate, by using standard photolithograpy and reactive ion etching. The polyimide structures were arrays 5 mm long, one micron tall, 0.6 micron wide, spaced 0.6 micron apart. The sidewalls were vertical with respect to the silicon substrate. Thus, the bottoms of the trench structures consists of bare silicon surface and the raised portions consist of the polyimide. The 0.38 mm thick wafers, patterned with the polyimide trench structures, were scribed and cleaved into 1×1 cm samples for use in the experiments. The native silicon dioxide was removed by dipping the sample in 10% buffered HF and rinsing it in triply-distilled water, immediately before mounting it on a resistive heater attached to a manipulator and pumping down to high vacuum. The vacuum chamber used in this work, pumped by a 6-in., liquid nitrogen-trapped, diffusion pump, had a base pressure of $3 \times 10^{-8}$ Torr. The sample temperature was monitored by a Pt-10% Pt/Rh thermocouple pressed against the sample front surface.

In the preferred embodiment, the sample was heated to 300° C. at rate of approximately 10 degrees/min. After stabilizing the temperature at 300° C., the sample was moved to within 3 mm from and normal to the end of a 12 mm-diam doser tube to begin deposition. Ultra-high purity hydrogen, at a pressure of $2.0 \times 10^{-5}$ Torr, was continuously flowed onto the substrate. The Pt precursor gas, $Pt(PF_3)_4$ (Strem Chemical), controlled by a needle valve, was mixed downstream with the hydrogen gas in the doser tube, until the total pressure reaches $2.3 \times 10^{-5}$ Torr. After 40 minutes of deposition time, the $Pt(PF_3)_4$ was shut off. At this point all the surfaces on the sample were coated with a thick Pt film. Then the sample was cooled slowly to room temperature at a rate of approximately 10 degrees/min, at which the hydrogen gas was shut off. The sample was then manipulated into a position with its surface normal to the beam axis of a Perkin-Elmer sputtering ion gun. With a steady-state flow of Ne at a chamber pressure of $1.6 \times 10^{-4}$ Torr, a 2.0 keV Ne ion beam with a beam diameter of 3-5 mm at a beam current of 18 microampere sputter-removed the Pt film from the horizontal surfaces of the trench structures (bottoms and tops). The sputtering step took approximately 90 minutes and was visually monitored by the appearance of a dark spot from the underlying substrate. At this point the ion energy was lowered to 500 eV and $2 \times 10^{-5}$ Torr $XeF_2$ gas was concurrently flowed onto the same spot with the use of a 3.2 mm diam stainless steel doser tube. The resulting anisotropic ion beam-assisted etching, normal to the substrate, removed the exposed silicon from the bottom of the new trench structure without appreciably removing the Pt vertical sidewall and the polyimide structures. This etching step was terminated after 60 minutes. The sample was removed and cross-sectioned for analysis by scanning electron microscopy which showed that the new trenches in the silicon substrate were about 0.04 micron wide and 0.6 micron deep. Some silicon trenches were found to be as narrow as 0.03 micron.

To remove the "fixed" polyimide buttress structures with attached Pt deposition layer left on the substrate after the etching process, oxygen plasma (in $O_2$ plasma reactor for about ½ hour) was used to remove the polyimide and hot (about 100° C.) aqua regia acid (a mixture of HCl and $HNO_3$) was used for one hour to remove the Pt sidewalls (i.e. Pt deposition layer formerly attached to essentially vertical surfaces of buttresses). In some cases, fixed buttresses and the attached sidewalls can be lifted off of the substrate using adhesive tape.

EXAMPLE 2

In a second embodiment, the sample was heated to 298° C. at a rate of approximately 10 degrees/min. After stabilizing the temperature at 298° C., the sample was moved to 3 mm from and normal to the end of a 12 mm-diam doser tube. $2 \times 10^{-6}$ Torr of $Pt(PF_3)_4$ and $2.0 \times 10^{-5}$ Torr of hydrogen, each controlled by a needle valve, were mixed in the dosing tube and continuously flowed onto the substrate. After 30 minutes of deposition time, the $Pt(PF_3)_4$ gas was shut off, and the sample was cooled slowly to room temperature at a rate of approximately 10 degrees/min, at which the hydrogen gas was shut off. The sample was then manipulated into a position with its surface normal to the beam axis of a Perkin-Elmer sputtering ion gun. With a steady-state flow of Ne at a chamber pressure of $1.6 \times 10^{-4}$ Torr, a 1.0 keV Ne ion beam with a beam diameter of 3-5 mm at a beam current of 14 microampere, sputter-removed the Pt film from the horizontal surfaces of the trench structures. The sputtering step took approximately 120 minutes and was visually monitored by the appearance of a dark spot from the underlying substrate. At this point the ion beam energy was lowered to 500 eV and $1 \times 10^{-5}$ Torr $XeF_2$ gas is concurrently flowed onto the same spot with the use of a 3.2 mm diam stainless steel doser tube. The resulting anisotropic ion beam-assisted etching, normal to the substrate, removed the exposed silicon from the bottom of the new trench structures without appreciably removing the Pt vertical sidewall and the polyimide structures. This etching step was terminated after 20 minutes. Subsequent scanning electron microscopy analysis showed that the new trenches in the silicon substrate were about 0.3 micron wide and 0.5 micron deep.

EXAMPLE 3

In a third embodiment, five alternating layers of platinum and cobalt were used, instead of the previous single thick layer of Pt. The sample was heated to 295° C. at a rate of approximately 10 degrees/min. After stabilizing the temperature at 295° C., the sample was positioned to within 3 mm from and normal to the end of a 12 mm diameter doser tube. $1 \times 10^{-5}$ Torr of $Pt(PF_3)_4$ and $2 \times 10^{-5}$ Torr of $H_2$, each controlled by a needle valve, were mixed in the dosing tube and continuously flowed onto the substrate. After 20 minutes of deposition time, the $Pt(PF_3)_4$ was shut off while the same flow of $H_2$ continued. Then, $3 \times 10^{-5}$ Torr of $Co_2(CO)_8$, controlled by a third needle valve, was mixed in the dosing tube with the $H_2$ and continuously flowed onto the substrate. After 15 minutes of deposition time, the $Co_2(CO)_8$ was shut off. Next, the same procedure for $Pt(PF_3)_4$ dosing (at $1 \times 10^{-5}$ Torr and for 20 minutes) was repeated. This is followed by the same procedure for $Co_2(CO)_8$ dosing as before. After the Co deposition, the Pt deposition step is repeated once more. The final metallic coating consisted of alternating Pt/Co/Pt/Co/Pt layers. After the final Pt layer was deposited, the sample was cooled down to room temperature at an approximate rate of 10 degrees/min. At this stage, scanning electron microscopy analysis of the top view of the sample showed that the gap width 80a of the trenches had narrowed to about 0.1 micron. The sample was then placed in a sputtering chamber and moved into a position with its surface normal to the beam axis of a Perkin-Elmer sputtering ion gun. With a steady-state flow of Ne at a chamber pressure of $1.5 \times 10^{-4}$ Torr, a 1.0 keV Ne ion beam with a beam diameter of 3–5 mm at a beam current of 18 microamperes sputter-removed the layered metal coating from the horizontal surfaces of the trench structures. The sputtering step took approximately 200 minutes. At this point the ion beam energy was lowered to 500 eV and $1.4 \times 10^{-5}$ Torr of $XeF_2$ was concurrently flowed onto the same region on the sample with the use of a 3.2 mm diameter stainless steel doser tube, for 18.5 minutes. Subsequent scanning electron microscopy (SEM) analysis showed that the new trenches etched in the silicon substrate were about 0.1 micron wide and 0.5 micron deep. Moreover, SEM also revealed that the metal multi-layer was non-conformal and had an "overhang" that made the gap width at the top of the trench less than the gap width near the bottom of the trench. (See, for example, FIG. 6b). Energy dispersive x-ray analysis revealed that the overall composition of the metal coating was approximately 55% Co and 45% Pt.

EXAMPLE 4

The fourth embodiment involves the use of "removable and reusable" template structures, in contrast to the previously used "fixed" structures. Fabricate the buttress structures out of a thin silicon membrane (or a membrane of some other etchable material). Use conventional photolithography to lay down a mask pattern. Directionally etch through the unprotected areas of the membrane. The etched-through areas constitute the openings of the buttress structures.

Physically attach the "removable" buttress pattern to an essentially flat substrate using, for example, silver paint or microclips. Attach the substrate to the heater in the deposition chamber (see FIG. 4). Use the same deposition procedures described in the previous embodiments to deposit a deposition layer which narrows the opening dimensions to the desired sub-half micron sizes. Thereafter, carefully remove the resulting template structure from the substrate. Physically place the template on top of any new substrate on which trenches, holes, or vias of sub-half micron dimensions are to be etched. Etch the substrate using dry directional etching such as RIE that will selectively etch the exposed portions of the new substrate without etching the unexposed portions of the substrate covered by the template wherein the exposed portions of the substrate lie within the sub-half micron openings contained in the template.

EXAMPLE 5

Fabricate the buttress structures out of micro-channel glass. Micro-channel glass is made of mixtures of largely oxide materials, containing a large portion of $SiO_2$. Cut the channel glass into thin parallel plate form which contains openings with largely circular cross-sections running from one surface of the plate through to the other surface in a direction perpendicular to the surfaces. The opening diameters can range from many microns to less than 0.1 micron. Use micro-channel plates having diameters of 1 micron or less. If necessary, thin the channel glass plate by a variety of means such as chemical-mechanical polishing, reactive-ion etching, or ion beam sputtering. If necessary, support to the channel glass plate by attaching a thicker or stronger support material. Attach the removable channel glass pattern to a flat substrate using, for example, silver paint or microclips.

Attach the substrate to the heater in the deposition chamber (see FIG. 4). Use the same deposition procedures described in the previous embodiments to deposit a deposition layer which narrows the opening dimensions to the desired sub-half micron sizes. Thereafter, carefully remove the resulting channel glass template structure from the substrate. Physically place the channel glass template on top of any new substrate on which trenches, holes, or vias of sub-half micron dimensions are to be etched. Etch the substrate using dry directional etching such as RIE that will selectively etch the exposed portions of the new substrate without etching the unexposed portions of the substrate covered by the channel glass template wherein the exposed portions of the substrate lie within the sub-half micron openings contained in the channel glass template.

What is claimed is:

1. A method for fabricating sub-half-micron width trenches, holes or vias on a substrate, comprising the steps of:
    providing a substrate, said substrate having a first horizontal surface;
    attaching a removable and reusable template, defining sub-half micron openings lined with a deposition layer material therein, to said first horizontal surface of said substrate;
    etching said first horizontal surface through said openings of said removable and reusable template to form holes, trenches or vias of sub-half micron width in said first horizontal surface of said substrate; and
    lifting off said removable and reusable template leaving intact said substrate containing said trenches, holes or vias of sub-half micron width.

2. The method of claim 1 wherein said attaching step further comprises the step of using microclips to attach said removable and reusable template to said first horizontal surface of said substrate.

3. The method of claim 1 wherein said attaching step further comprises the step of using an effective amount of silver paint as a glue to attach said removable and reusable template to said first horizontal surface of said substrate.

4. The method of claim 1 wherein said removable and reusable template is further comprised of buttress material selected from the group consisting of Si, $SiO_2$, polyimides, photoresists, non-glass metal oxides and mixtures thereof and said deposition layer material selected from the group consisting of Si, $SiO_2$, metal oxides, metals and mixtures thereof lining said openings.

5. The method of claim 1 wherein said removable and reusable template is further comprised of buttress material further comprising glasses and said layer deposition material selected from the group consisting of Si, $SiO_2$, metal oxides, metals and mixtures thereof lining said openings.

6. The method of claim 1 wherein said removable and reusable template is further comprised of buttress material selected from the group consisting of Si, $SiO_2$, polyimides, photoresists, non-glass metal oxides and mixtures thereof and said deposition layer material selected from the group consisting of Pt, Ni, Pd, Fe, W, Cr, Mo, Co, Ru, Rh, Re, Ir, Os, Al, Cu, Si, $SiO_2$, metal oxides and mixtures thereof lining said openings.

* * * * *